United States Patent [19]

Siemon et al.

[11] Patent Number: 4,947,115

[45] Date of Patent: Aug. 7, 1990

[54] TEST PROBE ADAPTER

[75] Inventors: John A. Siemon, Watertown; Brian E. Reed, New Hartford, both of Conn.

[73] Assignee: The Siemon Company, Watertown, Conn.

[21] Appl. No.: 293,891

[22] Filed: Jan. 5, 1989

Related U.S. Application Data

[62] Division of Ser. No. 202,956, Jun. 6, 1988, Pat. No. 4,883,430.

[51] Int. Cl.5 ........................ G01R 1/06; G01R 31/02; H01R 13/639

[52] U.S. Cl. ................................ 324/158 P; 324/72.5; 324/158 F; 439/912

[58] Field of Search ............... 324/158 P, 158 F, 72.5; 439/592, 829, 835, 912

[56] References Cited

U.S. PATENT DOCUMENTS

| | | | |
|---|---|---|---|
| 4,105,970 | 8/1978 | Katz | 324/72.5 |
| 4,112,363 | 9/1978 | Morrison et al. | 324/158 F |
| 4,132,946 | 1/1979 | Holdren et al. | 324/158 P |
| 4,417,206 | 11/1983 | Stowers | 324/158 P |
| 4,632,485 | 12/1986 | Brown et al. | 439/912 |

*Primary Examiner*—Ernest F. Karlsen

*Attorney, Agent, or Firm*—Fishman, Dionne & Cantor

[57] ABSTRACT

A test probe adapter for mounting on a bridge clip carrier or the like is presented. The test probe adapter includes an insulative housing having a pair of conductive test posts extended outwardly from the top and bottom of the housing. Attached to the bottom of each test post is a spring-loaded test probe mechanism which terminates at a probe tip. The test adapter further includes opposed biased hinged levers. These levers each terminate at a shoulder which is adapted for grasping and retaining the flattened top portion of a handle on a bridge clip carrier or the like.

2 Claims, 5 Drawing Sheets

TEST PROBE ADAPTER

This is a divisional of co-pending application Ser. No. 202,956 filed on June 6, 1988, now U.S. Pat. No. 4,883,430.

BACKGROUND OF THE INVENTION

This invention relates to the field of electrical bridging clips which may be used to interconnect a plurality of electrical terminals which are spaced apart in horizontal rows and vertical columns. More particularly, this invention relates to a new and improved bridge clip carrier for transporting bridge clips and easily attaching the clips to appropriate locations over connectors in a terminal block.

Terminal connecting blocks are used extensively in the fields of electronics and communications. For example, they are used by the telephone industry in distribution cabinets for connecting conductors in a cable from an exchange to other conductors extending to various stations within a building One type of terminal connecting block is disclosed in U.S. Pat. No. 3,234,498 and comprises a plurality of connector elements arranged in spaced horizontal rows and vertical columns of terminals in a connector block. Each element comprises a plurality of connectors joined together at a base portion. Each of the connectors is of the insulation penetrating type, i.e. the insulation on an electrical conducting wire is sheared when the wire is inserted in the connector.

It is often desired or required to interconnect a plurality of electrical terminals which are spaced apart in rows or columns. A well known connecting technique which has become widely accepted by those skilled in the art is to utilize a one-piece metal connector clip of approximate U-shape and termed a bridging clip. Bridging clips similar to the type hereinabove discussed are disclosed in U.S. Pat. No. 4,029,376; U.S. Design Pat. No. 224,406 and U.S. Pat. No. 4,575,168. U.S. Pat. No. 4,029,376 describes a plurality of bridging or connector clips separately attached at desired intervals along a longitudinal supporting means capable of interconnecting vertical columns of electrical terminals.

In many applications, it is desired to interconnect horizontal rows of electrical connectors. To accomplish this task, bridging clips with lengths large enough to span the distance between two or more electrical connectors have been available (the length being dependent on the number of connectors to be interconnected).

As previously discussed, electrical connectors similar to U.S. Pat No 3,234,498 comprise a plurality of terminals at particular intervals When connecting those terminals arranged in a horizontal row, the individual bridging clip is visually aligned by the installer and after a downward force, is engaged by the bias action inherent in the U-shaped metal clip. It will be appreciated that such bridging clips are relatively small and difficult to handle. As a result, problems occur during installation in trying to manually manipulate the clips onto connectors. These problems incur greater labor time and consequently increased installation costs. Installation time is also increased because only one bridging clip may be attached at a time. Thus, when an entire row of bridge clips is needed, each clip must nonetheless be loaded individually. This situation is both time consuming and frustrating to the bridge clip installer.

Still another problem with conventional bridge clips is that undesired shorting may occur due to the lack of an insulative covering on the bridge clip.

U.S. Pat. No. 4,553,802 overcomes some of these problems by disclosing a two-piece insulative housing for carrying a plurality of bridge clips therein. The insulative housing has compartments therein which terminate at slots for retaining discrete bridge clips. The bridge clips are loosely housed in the cavities to permit longitudinal displacement. In addition, opposed ramp means are provided adjacent to the slots for urging the arms of the bridge clip outwardly during bridge clip removal. The opposed ramps prevent loading of the bridge clips through the slots and thus necessitate that the insulative housing be two-piece so that the bridge clips may be loaded during assembly.

U.S. Pat. No. 4,430,524 is also directed to an insulative housing for bridge clips. This patent discloses a housing suitable only for a single bridge clip which is contoured and dimensioned to effect an interference fit and thereby enhance retention of the clip. Also, opposed nibs are provided to engage opposed and corresponding openings in the bridge clip. It will be appreciated that a drawback of the bridge clip cover of U.S. Pat. 4,430,524 is that it may be used only with a single bridge clip; and therefore does not permit decreased installation time, as does for example, the bridge clip holder of U.S. Pat. No. 4,553,802.

A significant drawback to prior art bridge clip holders of both U.S. Pat. Nos. 4,553,802 and 4,430,524 is that there is no provision for testing sinCe the bridge cliPs are completely encased in the housing.

SUMMARY OF THE INVENTION

The above-discussed and other problems of the prior art are overcome by the bridge clip carrier and installation device of the present invention. In accordance with the present invention, a novel bridge clip carrier is provided wherein a plurality of bridge clips are disposed in a housing; and wherein the clips can then be easily and simultaneously installed onto connectors in a terminal block.

The bridge clip carrier of the present invention comprises a one-piece molded insulative housing having at least two cavities for receiving discrete metal bridge clips which are then snap locked in the cavities. Each cavity has an open ended slot which permits loading of a bridge clip therein and is adapted for receiving a terminal from a terminal block. The cavity further includes stepped-in side portions near the slot which act to narrow the width thereof towards the top of the housing. Each discrete bridge clip is snap locked into a cavity by opposed extensions which mate with pre-existing grooves in the bridge clips. The improved design of this invention includes fewer housing components than prior art designs resulting in reduced manufacturing and assembly costs.

An important feature of the present invention is the presence of apertures on the top face of the housing which expose the bridge clips and which are sized for receiving a suitable test probe. Thus, the bridge clip carrier of the present invention permits ease of testing of the electrical circuit subsequent to installation. In addition, a plurality of the one-piece molded housings may be adjacently stacked on a terminal block and so provide a very low cost alternative to existing prior art bridge clip carriers.

In a preferred embodiment, a novel test probe specifically configured for use with the bridge clip carrier of the present invention is also provided.

It will be appreciated that the bridge clip carrier block of the present invention may be designed to hold any suitable number of bridge clips depending on the situation. Thus, the present invention provides improved ease in handling bridge clips as well as permitting plural clips to be inserted on connectors in a single quick operation.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1:
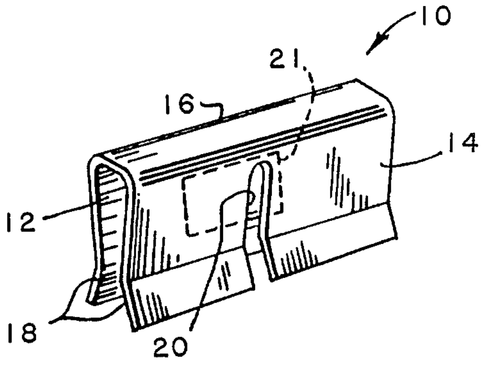
FIG. 1 is a perspective view of a typical bridge clip used in conjunction with the present invention.
Figure 2:
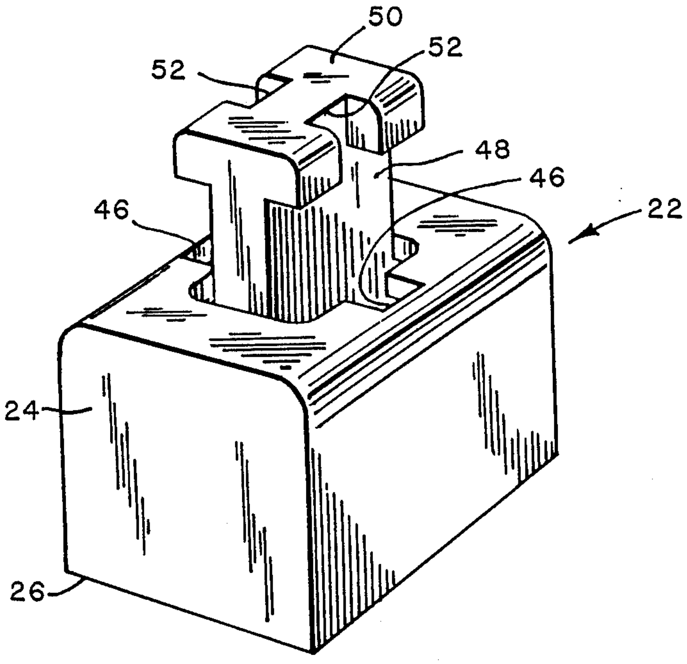
FIG. 2 is a perspective view of a bridge clip carrier in accordance with the present invention.
Figure 3:
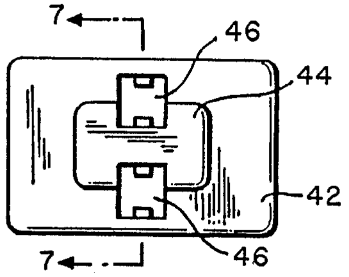
FIG. 3 is a plan view of the bridge clip carrier of FIG. 2 without bridge clips therein.

Referring first to FIG. 1, a typical bridging clip 10 used in conjunction with the bridge clip carrier and installation block of the present invention is shown. Bridging clip 10 is in the form of an integral piece of metal of approximate U-shape in cross-section. The outer arm portions 12 and 14 extend from the base 16 and converge toward each other for a section of their length to contact points 18 and then diverge outwardly. A vertical slot 20 runs down the center of arm portion 14. In addition, a window (see 21 in FIG. 7) is provided through arm portion 16 which is opposed to the upper portion of slot 20. It will be appreciated that the bridging clip 10 shown in FIG. 1 is merely an example of a typical bridge clip which may be used in conjunction with the bridge clip carrier of the present invention. Of course, any other suitable bridge clip such as mentioned earlier may also be used therewith.

As discussed, it is often desirable to interconnect two or more terminals in a connecting block by the use of a bridging clip. Unfortunately, due to the small size of these clips, manipulation and installation or removal thereof can be time consuming and tedious. Moreover, each bridge clip must be individually inserted on terminal connectors adding to labor, time and expense. The bridging clip carrier of the present invention shown in FIGS. 2–8 alleviates these problems by providing an inexpensive means for quickly and easily inserting and removing plural bridge clips on selected connectors.

Referring now to FIGS. 2–8, a bridge clip carrier in accordance with the present invention is shown generally at 22. Bridging clip carrier 22 essentially consists of a one-piece, molded block 24, preferably of rectangular shape and comprised of a suitable insulative, generally plastic material. The bottom face 26 of block 24 (see FIGS. 6, 7 and 8) includes spaced, parallel openings or slots 28 which access the interior of block 24. Each opening 28 leads into a cavity 30 which is dimensioned to accept and retain a bridge clip 10 disposed therein (see FIGS. 7 and 8).

Figure 7:
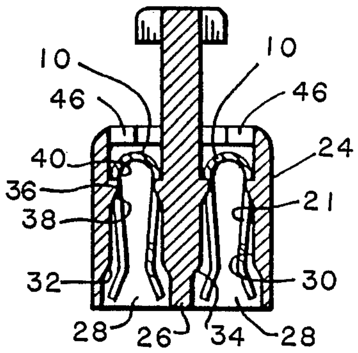
FIG. 7 is a cross-sectional elevation view of the bridge clip carrier of FIG. 2 having bridge clips disposed therein.
Figure 4:
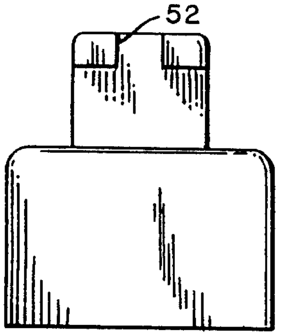
FIG. 4 is a side elevation view of the bridge clip carrier of FIG. 2.
Figure 5:
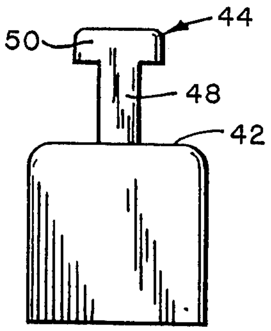
FIG. 5 is an end view of the bridge clip carrier of FIG. 2.
Figure 6:
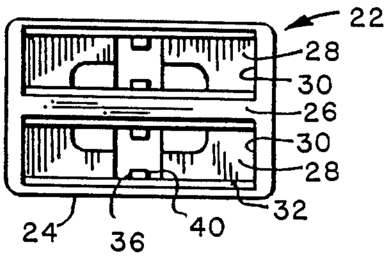
FIG. 6 is a bottom view of the bridge clip carrier of FIG. 1 without bridge clips therein.
Figure 8:
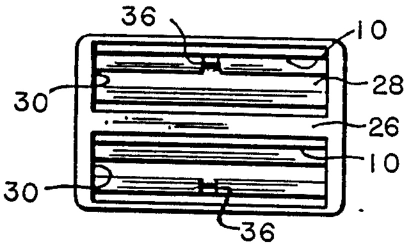
FIG. 8 is a bottom view, similar to FIG. 6, but with bridge clips loaded therein.
Figure 9:
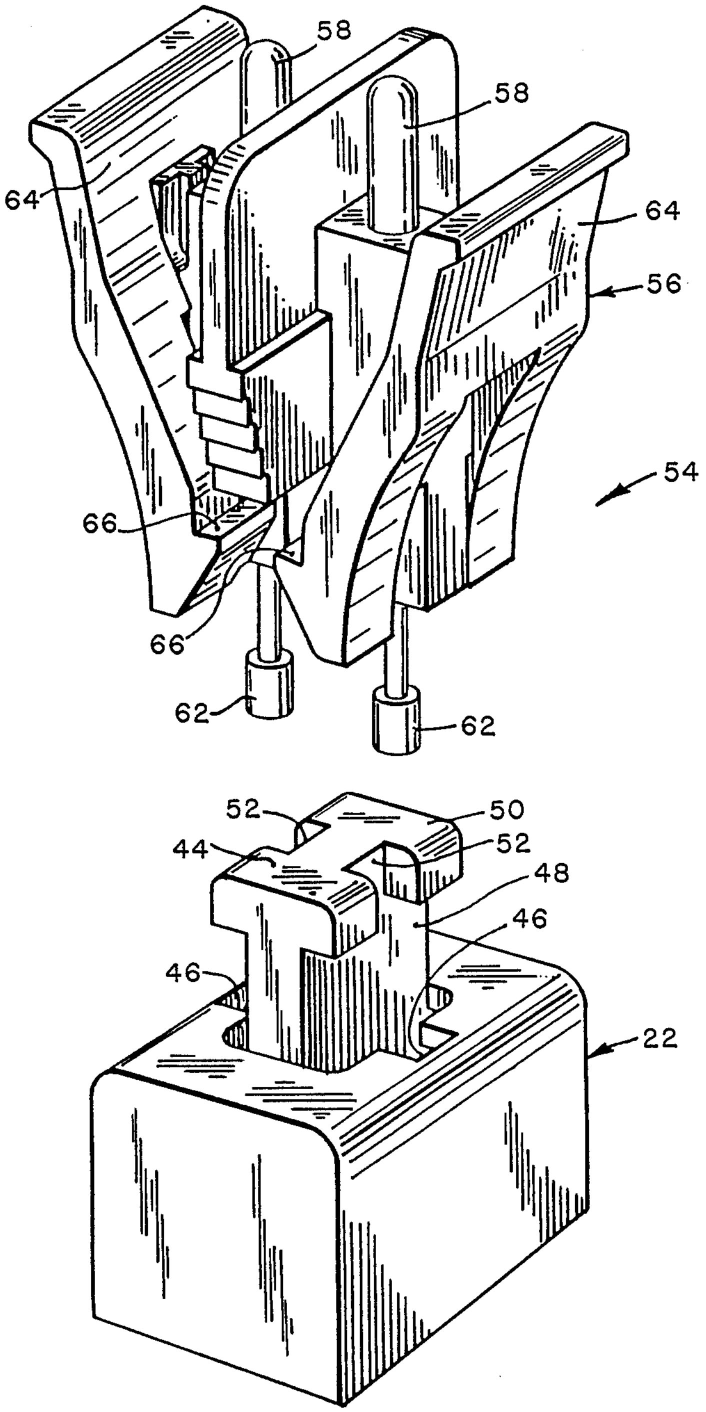
FIG. 9 is a perspective view of a test probe device being mounted onto the bridge clip carrier of FIG. 2.

The interior of each cavity 30 includes opposed stepped-in side portions 32 and 34 spaced from slot 28 which act to narrow the cavity and limit the degree of lateral movement of the bridge clip within the cavity. The upper portion of each cavity 30 includes a pair of opposed triangular extensions 36 which have a ramped surface 38 diverging away from slot 28 and terminating at a flattened portion 40 which is parallel to bottom surface 26. As shown in FIG. 7, the flattened portion 40 of each extension 36 respectively engages the slot 20 and window 21 of bridge clip 10 to thereby retain the bridge clip within the cavity. Significantly, the bridge clip 10 may be easily loaded through each slot 28 and into each cavity 30 from the bottom face 26 of housing 24, whereupon the extensions 36 will effect a snap-lock 20 with the slot and window 21 so that base portion 16 of bridge clip 10 will be retained within the cavity.

The top surface 42 of housing 24 includes a handle 44 for manipulating and installing bridge clip carrier 22 onto the terminals of a terminal block. Top surface 42 also includes a pair of registered apertures 46 on either side of handle 44. Apertures 46 permit communication between the exterior of housing 24 and each bridge clip 10 within housing 24. As a result, suitable test probes may be used to test the bridge clip connection with the terminal block subsequent to installation.

In a preferred embodiment of the present invention, handle 44 includes a stem portion 48 and a flattened top portion 50 transverse to stem 48. Flat top portion 50 further includes a pair of registered grooves 52 which register with a respective aperture 46. This preferred handle configuration is then used in conjunction with the sPecially configured test adapter shown in FIGS. 9–12.

Figure 10:
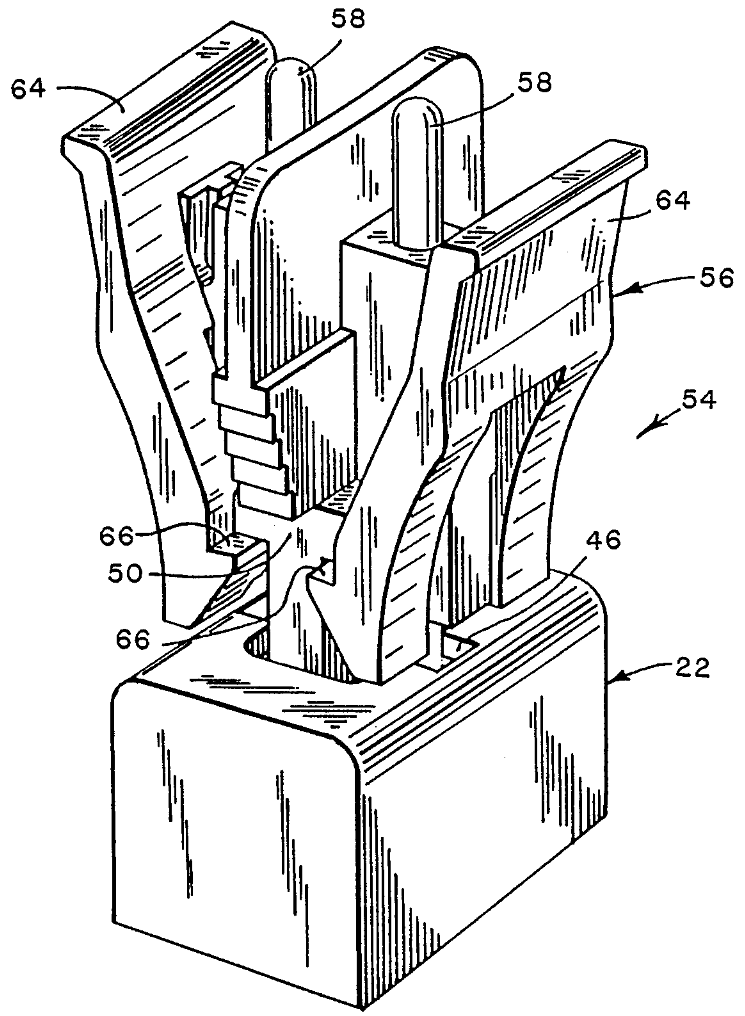
FIG. 10 is a perspective view of the components of FIG. 9, subsequent to mounting.
Figure 11:
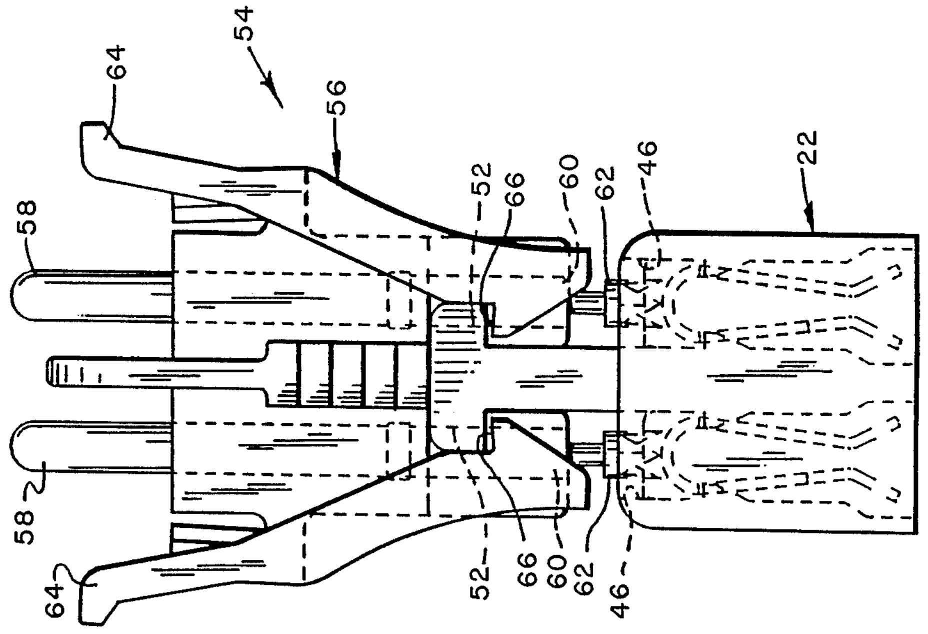
FIG. 11 is an end view of the assembly of FIG. 10.
Figure 12:
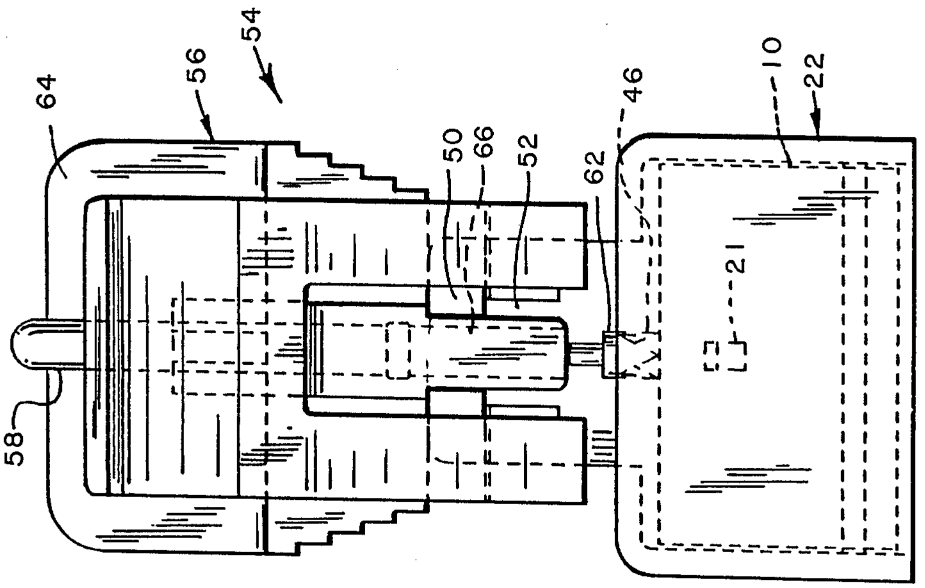
FIG. 12 is a side elevation view of the assembly of FIG. 10.

Turning to FIGS. 9–12, a test adapter is shown generally at 54. Test adapter 54 includes an insulative housing 56 having a pair of conductive test posts 58 extending outwardly from the top and bottom of housing 56. Attached to the bottom of each test post 58 is a spring-loaded test probe mechanism 60 which terminates at a probe tip 62. Test adapter 54 further includes opposed biased hinged levers 64. Levers 64 each terminate at a shoulder 66 which is adapted for grasping and retaining the flattened top portion 50 of handle 44. As shown in FIG. 9–12, test adapter 54 is mounted on bridge clip carrier 10 by inserting circular edge 62 of the spring-loaded test probe mechanism 60 through apertures 46 onto bridge clips 10. A downward force is then exerted so that the springs in mechanism 60 are biased As a result, the four shoulders on levers 64 will contact flattened top 50 of handle 44. Levers 64 are then pivoted outwardly to clamp onto handle 44 as shown in FIG. 10. During this procedure, test posts 58 will be received by grooves 52. At this point, alligator clips or the like may be attached to the test posts 58 for testing of the terminal block. As shown in FIGS. 11 and 12, circular edges 62 may be serrated in a preferred embodiment It will be appreciated that while a novel test probe device 54 has been shown in FIGS. 9–12, any other suitable test probe device may be used in conjunction with the present invention. Also, while a bridge clip carrier having two cavities for holding one pair of bridge clips has been shown, the present invention contemplates any number of bridge clip cavities and corresponding bridge clips.

While preferred embodiments have been shown and described, various modifications and substitutions may be made thereto without departing from the spirit and scope of the invention. Accordingly, it is to be understood that the Present invention has been described by way of illustrations and not limitation

What is claimed is:

1. A test probe adapter for connecting to an electrical device, comprising:

an insulative housing having a top and a bottom;

a pair of spring-activated electrically conductive test posts, said test posts extending outwardly from said top and bottom of said housing;

a pair of biased hinged levers positioned on opposed surfaces of said housing, said levers each having a top end and a bottom end;

hook means, positioned near the bottom end of each lever, for grasping a surface of the electrical device;

ramp means positioned at the bottom end of each lever for pivotably displacing said hook means to allow engagement with the surface of the electrical device; and registration means for preventing axial movement of the test probe adapter relative to the electrical device.

2. The adapter of claim 1, wherein:

each test post terminates at a circular serrated edge.

* * * * *